United States Patent [19]
Palmer

[11] Patent Number: 5,818,857
[45] Date of Patent: Oct. 6, 1998

[54] STABILIZED DFB LASER

[75] Inventor: James R. Palmer, LaCosta, Calif.

[73] Assignee: SynComm Inc., San Diego, Calif.

[21] Appl. No.: 811,207

[22] Filed: Mar. 5, 1997

[51] Int. Cl.$^6$ ....................................................... H01S 3/10
[52] U.S. Cl. ................................ 372/32; 372/34; 372/96; 372/102
[58] Field of Search ................................. 372/32, 34, 29, 372/96, 25, 99, 102, 107

[56] References Cited

U.S. PATENT DOCUMENTS

| | | | |
|---|---|---|---|
| 5,392,303 | 2/1995 | Shiozawa et al. | 372/34 |
| 5,604,758 | 2/1997 | AuYeung et al. | 372/34 |

OTHER PUBLICATIONS

Palmer, J.R., Steen, W.M., and Martellucci, S., *Analytical Model For Aberrated Diffraction In High Power CW Laser Beam Trains: Laser Cavity To Work Piece*, 238 Laser Applications For Mechanical Industry, 77–97, Kluwer Academic Publishers (1992). (No month).

Palmer, J.R., *Continuous Wave Laser Damage on Optical Materials*, 22–4 Optical Engineering, 435–446 (Jul./Aug. 1983).

*Primary Examiner*—James W. Davie
*Attorney, Agent, or Firm*—Welsh & Katz, Ltd.

[57] ABSTRACT

A method and apparatus are provided for stabilizing a distributed feedback semiconductor laser. The method includes the steps of comparing an optical output of a first oscillating mode of the semiconductor laser at a first polarization angle with an optical output of a second oscillating mode of the semiconductor laser at a second polarization angle orthogonal to the first polarization angle. A first feedback signal is provided to a cavity temperature controller of the semiconductor laser in response to detected differences of the compared first and second oscillating modes. The method further includes the step of comparing an output of the reference laser with an output of the semiconductor laser and providing a difference signal as a second feedback signal to the temperature controller of the semiconductor laser in response to detected differences between the reference laser and semiconductor laser.

52 Claims, 3 Drawing Sheets

STABILIZED DFB LASER

FIELD OF THE INVENTION

The field of the invention relates to lasers and in particular to the stabilization of lasers used for cable television transmissions.

BACKGROUND OF THE INVENTION

The use of lasers for the transmission of information in communication systems is known. Such use has typically been limited to amplitude modulated systems that in use often attain a speed of several megabytes.

Laser systems in current use for communications are typically amplitude modulated because of certain inherent limitations in a laser's ability to change frequency. Lasers, in fact, are often limited to a single frequency or a narrow range of frequencies. The tendency of a laser to operate within narrow ranges is inherent in the resonant cavity used in the generation of laser signals.

A resonant cavity of a laser is designed to amplify optical signals of a desired frequency and attenuate signals of an undesired frequency. The cavity amplifies desired frequencies through use of a laser cavity dimensioned in one-quarter wavelength increments. The closer the cavity dimensions are to a desired tolerance, the narrower the range of frequencies within which the laser will operate (the linewidth). The narrower the linewidth, the less inherent noise will be transmitted in a laser signal. Further, the narrower the linewidth, the more power is focused into a desired center frequency.

While gas lasers have been developed with extremely narrow linewidths, solid state lasers do not perform nearly as well. Distributed feedback (DFB) semiconductor lasers, in fact, are known to have relatively wide linewidths.

As the junction current of a DFB laser is changed (or the cavity temperature changes), the operating frequency of the laser also changes. The linewidth may also vary. Static variations in the inside cavity dimensions may cause the cavity to inherently resonate at a number of frequencies. Variations in the junction current may cause a center frequency to shift (i.e., hop) from one resonant regime to another. Changes in cavity dimensions caused by temperature may have the same effect.

Because of their inherent low cost and reliability, DFB lasers have an enormous potential in laser communication systems. Consequently, a need exists for a method of controlling the linewidth of DFB lasers.

SUMMARY

A method and apparatus are provided for stabilizing a distributed feedback semiconductor laser. The method includes the steps of comparing an optical output of a first oscillating mode of the semiconductor laser at a first polarization angle with an optical output of a second oscillating mode of the semiconductor laser at a second polarization angle orthogonal to the first polarization angle. A first feedback signal is provided to a cavity temperature controller of the semiconductor laser in response to detected differences of the compared first and second oscillating modes. The method further includes the step of comparing an output of the reference laser with an output of the semiconductor laser and providing a difference signal as a second feedback signal to the temperature controller of the semiconductor laser in response to detected differences between the reference laser and semiconductor laser.

DETAILED DESCRIPTION OF THE INVENTION

Figure 1:
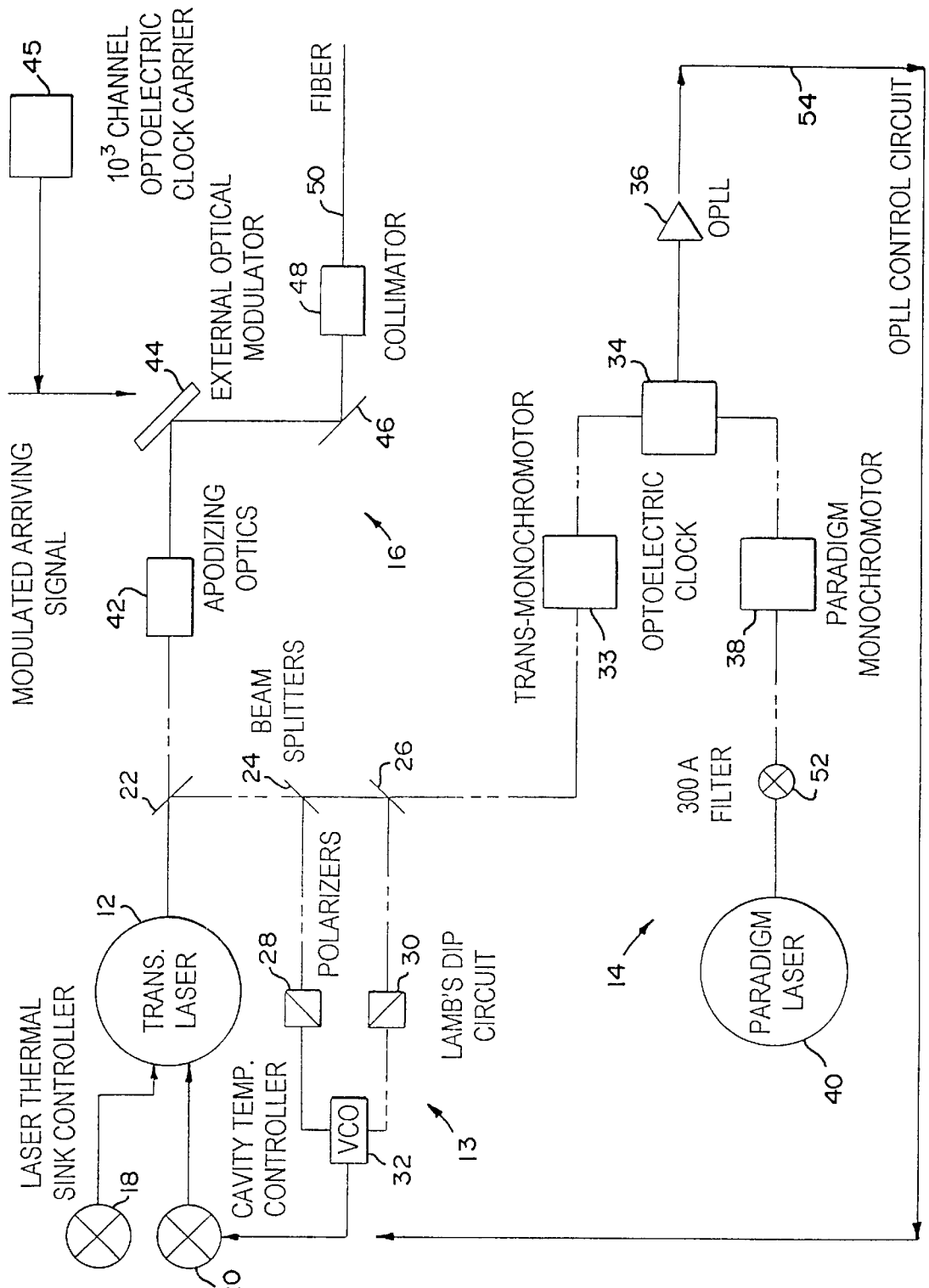
FIG. 1 is a block diagram of a stabilized laser transmission system in accordance with an embodiment of the invention.

FIG. 1 is a block diagram of a laser modulation system 10 generally in accordance with an embodiment of the invention. Included within the modulation system 10 is a transmitting laser 12, a first laser stabilization feedback section (circuit) 13, a second laser stabilization feedback section (circuit) 14 and a laser modulation section 16.

The transmitting laser 12 may be any distributed feedback (DFB) laser (1.3 $\mu$m wavelength) compatible with an appropriate temperature control. The junction current of the laser 12 is provided by a current controlled source (not shown) supplying a rated current with no more that 0.1% ripple.

Temperature control of the laser 12 is accomplished using an active heat control device 18 and balancing heat source 20. The active heat control device 18 can be a temperature control device located within a mounting surface (e.g., a heat sink) of the laser 12. The device 18 may be implemented using a thermocouple sensor and controller coupled to any thermally active temperature control device (e.g., a Peltier effect thermo-electric heater/cooler). The operating temperature of the heat control 18 of the laser 12 may be held to an appropriate setpoint temperature (e.g., 32° F.) with appropriate limitation on temperature variation (e.g., no more than 0.1° F.).

The balancing heat source 20 is directed to stabilization of cavity dimensions by temperature control and may be implemented using an appropriately sized nichrome wire wrapped around the outside of the cavity of the laser 12 and surrounded by a thermally conductive, electrically non-conductive material (e.g., soreison, etc). The heat source 20 may be used to provide an appropriately stable cavity temperature (e.g., 32.1° F.±0.001° F.) to restrict cavity mode hopping of an output of the DFB laser 12.

The paradigm laser 40 may be a low power diode laser operating with a junction current fixed to within 0.1% and operating at 1.3 $\mu$m wavelength. The paradigm laser 40 may be calibrated using an appropriate instrument standard (e.g., a Zeiss DK-2 Spectrophotometer using a quartz-iodine lamp that is NBS traceable) to a known energy level in each wavelength. The paradigm laser 40 may also be stabilized using a temperature controlled heat sink and an active temperature controller similar to that used by the transmitting laser 12.

The fundamental problem associated with the stability of the transmitting laser 12 and paradigm laser has been determined to be control of the resonant modes operating within the cavity. Control of the resonant modes, in turn, is highly dependent upon the dimension of the laser cavity. The temperature of the cavity has been determined to be a significant factor in the cavity dimension and laser stability. Further, where attempts are made to control the cavity temperature, the cavity temperature often overshoots a set point due to the thermal lag (and thermal mass) associated with each laser 12, 40. The solution to the problem, in fact, has been found to lie in control of the cavity temperature by modeling the laser cavity as a transient thermodynamic system. Using embedded thermistors an a summing operation amplifier, it has been found that the active temperature controller 18 can be adapted to follow the transient temperature using techniques previously described by the inventor (see for example, Palmer, J. R., *Transient Heat Transfer in Flat Plates,* Vol. II Constant Temperature, Pro Se Publications, San Diego, Calif. (1995)).

In the case of a thermal system which, for the first surface, has characteristics of:

$$R_\alpha < (5\sqrt{\alpha\tau} + R_o), t_o < 6\sqrt{\alpha\tau} \text{ and } R_o < 6\sqrt{\alpha\tau},$$

the convoluted transform will look like:

$$\Delta T_1 = \Delta T^0 \Psi_o \left( h_c \frac{\Delta T_0 \nabla \frac{\sqrt{\psi^{2.75}}}{\alpha} \sqrt{\nu}}{\Gamma \sqrt{\kappa^{3.75}}} \sqrt{-\beta^{1.75} + \mu^{2.75} + \zeta^{3.75}} \right),$$

and the deconvoluted transform will have the form:

$$\Delta T_1 = \left( \frac{2(\Delta^0 e^{(\frac{\tau R_0^2 \pi h_c}{\rho c_p R_\alpha^2 \pi t})} - T_1)\sqrt{\alpha\tau} \; \rho c_p R_\alpha^2 \pi t}{K\tau R_0^2 \pi} \Psi_o((ierfc(x)) - (ierfc(x_1)) + (ierfc(x_2))) \right) -$$

$$\left( \frac{2(\Delta^0 e^{(\frac{\tau R_0^2 \pi h_c}{\rho c_p R_\alpha^2 \pi t})} - T_1)\sqrt{\alpha\tau} \; \rho c_p R_\alpha^2 \pi t}{K\tau R_0^2 \pi} \Psi_o((ierfc(y)) - (ierfc(y_1)) + (ierfc(y_2))) \right) \times$$

$$(erfc(y) - e^{(t_o H_o + H_o^2 \alpha\tau)} erfc(z))) +$$

$$\left( \frac{2(\Delta^0 e^{(\frac{\tau R_0^2 \pi h_c}{\rho c_p R_\alpha^2 \pi t})} - T_1)\sqrt{\alpha\tau} \; \rho c_p R_\alpha^2 \pi t}{K\tau R_0^2 \pi} \Psi_o((ierfc(y)) - (ierfc(y_1)) + (ierfc(y_2))) \right) +$$

$$\left( \frac{2(\Delta^0 e^{(\frac{\tau R_0^2 \pi h_c}{\rho c_p R_\alpha^2 \pi t})} - T_1)\sqrt{\alpha\tau} \; \rho c_p R_\alpha^2 \pi t}{K\tau R_0^2 \pi} \Psi_o((ierfc(x)) - (ierfc(x_1)) + (ierfc(x_2))) \right) \times$$

$$(erfc(y) - e^{(t_o H_o + H_o^2 \alpha\tau)} erfc(z))),$$

where:

$$H_o = 0.5 \sqrt{\frac{\pi}{\alpha\tau}} \; => t_o \text{cm}^{-1},$$

$$z = \frac{t_o}{2\sqrt{\alpha\tau}} + H_o \sqrt{\alpha\tau},$$

$$x_1 = \frac{R_o}{2\sqrt{\alpha\tau}},$$

$$x_2 = \frac{R_\alpha}{2\sqrt{\alpha\tau}},$$

$$\xi x = \frac{1.0}{\sqrt{\pi}},$$

and:

$\Delta T° = T_1 - T_2$, in ° C., $T_1$ = constant source temperature in ° C., $t_1$ = starting temperature of the flat plate at $\tau = 0$° C., $h_c$ = heat transfer coefficient from temperature source in W/cm$^{2°}$ C., $F_{o\text{-}ang \; critical}$ = absorbed flux density in W/cm$^2$, $\alpha$ = thermal diffuseivity of material in cm$^2$/sec, $\tau$ = time interval that the heat source is running in seconds, $K$ = thermal conductivity of the material in W/cm$^{2°}$ C., $t_o$ = thickness of the flat plate component in cm, $c_p$ = specific heat of the plate material in W-sec/g° C., $p$ = density of the plate material in g/cm$^3$, $R_o$ = radius of the heat source beam on the plate per cm, $R_\alpha$ = radius of the flat plate in cm for any thickness greater than t=0 cm.

The temperature rise at some depth into the component at t>0 will follow from $$R_\alpha < 5\sqrt{\alpha\tau} + R_o, t_o < 6\sqrt{\alpha\tau}, \text{ and } R_o < 6\sqrt{\alpha\tau}.$$

The convoluted transform will have the form:

$$\Delta T_t = \Delta T^0 \Psi_o \left( h_c \frac{\Delta T_0 \sqrt{\sqrt{\psi^{3.75}}}}{\Gamma \sqrt{\kappa^{4.75}}} \right) + \Delta T^0 \Psi_o \left( h_c \frac{\Delta T_0 \sqrt{\sqrt{\psi^{5.85}}}}{\Gamma \sqrt{\kappa^{6.85}}} \right),$$

and when deconvoluted will have the form:

$$\Delta T_1 = \left( \frac{2(\Delta^0 e^{(-\frac{\tau R_0^2 \pi h_c}{\rho c_p R_\alpha^2 \pi t})} - T_1) \sqrt{\alpha\tau} \; \rho c_p R_\alpha^2 \pi t}{K\tau R_0^2 \pi} \; \Psi_o((ierfc(y_o)) - (ierfc(y_{o1})) + (ierfc(y_{o2}))) \right) -$$

$$\left( \frac{2(\Delta^0 e^{(-\frac{\tau R_0^2 \pi h_c}{\rho c_p R_\alpha^2 \pi t})} - T_1) \sqrt{\alpha\tau} \; \rho c_p R_\alpha^2 \pi t}{K\tau R_0^2 \pi} \; \Psi_o((ierfc(x)) - (ierfc(x_1)) + (ierfc(x_2))) \right) \times$$

$$(erfc(y) - e^{(t_o H_o + H_o^2 \alpha\tau)} erfc(z)))$$

where:

$$y_o = \frac{t}{2\sqrt{\alpha\tau}},$$

$$y_{o1} = \frac{\sqrt{t^2 + R_o^2}}{2\sqrt{\alpha\tau}},$$

$$y_{o2} = \frac{\sqrt{t^2 + R_\alpha^2}}{2\sqrt{\alpha\tau}},$$

and $0 < t \leq t_o$.

As demonstrated, the active temperature controller 20 can be provided which follows the non-linear response of the thermal mass of the heat sink of the laser in real time. Using the equations demonstrated above, appropriate scaling and response factors may be provided which track the thermal characteristics of the transmission laser 12 and paradigm laser 40.

Another factor is the control of the temperature of the laser cavity using the balancing heat source 20. Control of the balancing heat source 20 is established using a first feedback loop 13 and a second feedback loop 14. The first feedback loop 13 operates by stabilizing a natural emission frequency of the atoms of the cavity with a mode frequency of the cavity.

The objective of the first feedback loop 13 is to ensure that only a single laser frequency (mode) is present and that the laser 12 is stable in producing that single mode during operation. In general, the gain region of a DFB laser must be regarded as relatively wide. As such, several longitudinal modes of operation may normally be present during operation of a DFB laser. Under the invention, the gain region of the DFB laser 12 may be narrowed by adjusting the corrugations, but temperature control is still necessary. This is because the position of the gain profile depends on the bandgap and this phenomenon is extremely dependent upon variations in temperature. Consequently, a slight change in temperature could cause the position of the gain profile to shift sufficiently to cause the laser 12 to mode "hop" to another longitudinal mode more favorably disposed with regard to the gain profile.

As a means of developing a solution to the gain profile problem, it can be assumed that a single mode is oscillating at frequency $v_m$ which is greater than the natural emission frequency of the atom, $v_o$. The natural frequency and oscillating frequency $v_m$ creates two "holes" in the distribution.

The oscillation at frequency $v_m$ is a standing wave within the cavity, consisting of two waves traveling in opposite directions. The two waves can be designated by "+" and "−", respectively. Both waves have a frequency of $v_m$. The interaction of the waves traveling in the positive +vm direction with the laser medium will be greatest for those atoms that have a velocity component direction of $+v_x$, such that $$v_m = v_0 \left( \frac{1 + v_m}{c} \right).$$

There are, therefore, two groups of atoms whose stimulated emission contributes to the laser output intensity. The population inversion is reduced for these atoms and gain saturation occurs with regard to these atoms. Two "holes are burned" and they are symmetrical about $v_x = 0$ and correspond to atoms with velocities of plus and minus $v_x$. Under the embodiment, we can change the frequency of the oscillating mode until the peak frequency of the laser line is equal to the natural emission frequency (i.e., $v_m = v_o$). This can be accomplished by varying the length of the cavity by small variations in the cavity temperature. In changing the temperature ever so slightly, only a single group of atoms can contribute to the lasing process, viz., those with zero-x component of velocity, and providing only a single 'hole' in the population inversion-velocity curve. When this happens, the output power has been found to drop as the available inverted population is smaller than before.

The small increase in power resulting from the slight deviation from the center frequency of the laser 12 is used as a feedback in the first feedback loop 12 to stabilize the frequency of the laser 12 at the line center by minimizing the output. Because of the power differences, any drift in the mode frequency will cause one mode to increase in power and the other to decrease. The first feedback loop 13 is used to monitor the two different power levels and to subsequently to provide a feedback signal to control the cavity length.

Fundamentally, it has been found that adjacent cavity modes are plane polarized with their planes of polarization at right angles to each other. In order to isolate and capture the two cavity modes, the output signal of the laser 12 is split into two beams in beam splitters 24, 26. A polarizer 28, 30 inserted into the path of each beam. Each polarizer 28, 30 is oriented orthogonally with respect to the other, to isolate the two adjacent cavity modes. Two matched InGaAs detectors are used to detect the two modes. The difference in the output of the detectors 28, 30 is proportional to the difference in power of the two modes.

The output of the two detectors 28, 30 is provided as an input to a differential input voltage controlled oscillator (VCO) 32. The differential input from the two detectors 28, 30 is used by the differential input VCO 32 to adjust the power to the heating coil 20 to, in turn, change the length of the optical cavity of the laser 12. This, in turn, alters the mode frequencies of the laser 12. The operation of the first feedback loop 13 has been found to stabilize the frequency of the laser 12 to within 10 Å.

To further stabilize the laser 12, a second feedback loop 14 is provided. Within the second feedback loop 14, an output beam of the laser 12 is compared with an output beam of a reference paradigm laser 40 and the difference provided as a second feedback signal as a further means of achieving control over the stability of the laser 12.

Using a beam splitter 26, a small portion of the output beam of the laser 12 is provided as a first input to an optoelectronic clock 34 through a first monochrometer 34. A second input to the optoelectronic clock 34 is provided from the paradigm laser 40, through a second monochrometer 38. Under the embodiment, the first and second monochrometers 34, 38 may be constructed substantially the same.

Figure 2:
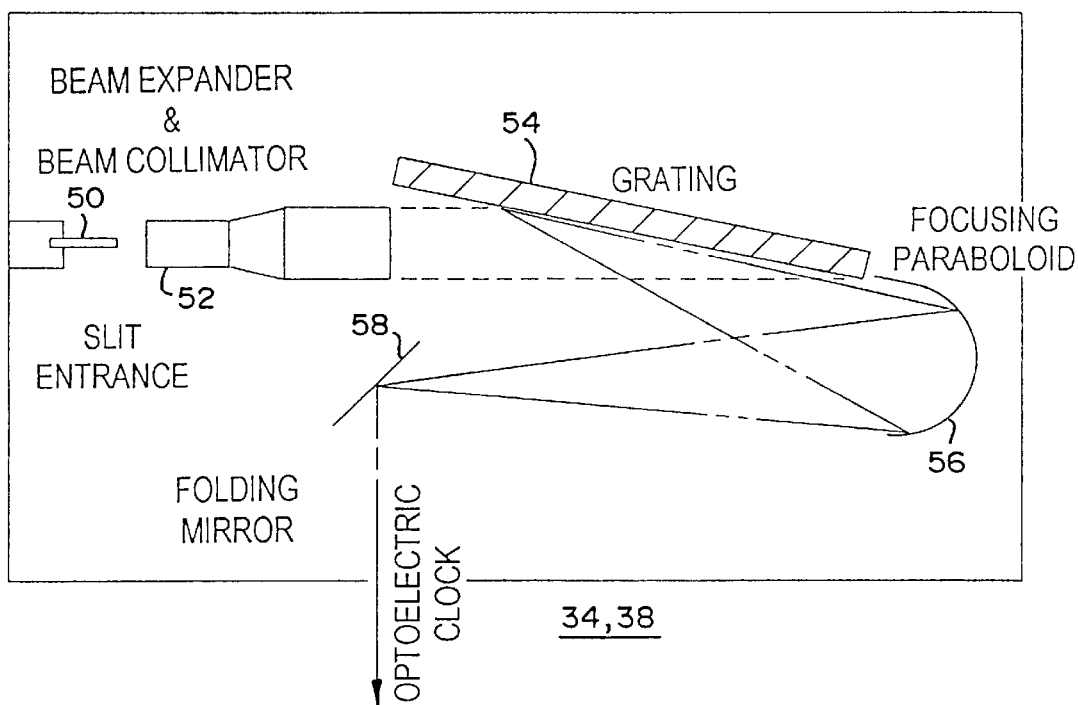
FIG. 2 is a schematic view of the monochrometer of the system of FIG. 1.

Within the monochrometer, the beam goes through a slit 50 (FIG. 2), passes through a beam expander-collimator 52 and then on to a grating 54. From the grating 54, the beam goes to a parabolic mirror 56 with a 24 cm focal length.

The slit 50 is fabricated with characteristics which limit the bandwidth of incident radiation. Under the embodiment, the dimensions of the slit 50 may be determined using an appropriate bandwidth limiting technique (e.g., see Richardson, D., *Diffraction Gratings,* Applied Optics and Optical Engineering, Vol. V, Part II, Optical Instruments, R. Kingslake, ed., Academic Press, New York, N.Y., (1969)).

The beam expander and collimator 52 are of conventional design for a 1.3 $\mu$m signal, using quartz optics. The grating 54 may be fabricated with a blaze angle of 24° and a line spacing of /f(13.4(10³))lines/inch or 527.559 lines/mm.

Where light is incident at an angle, $\alpha$, relative to the surface, normal to a reflecting grating, ruled with a spacing, d, the path difference for the light incident on any two adjacent grooves is d sin ($\alpha$). When this light is diffracted from the rulings at some other angle, $\beta$, the path difference for the light is further increased by the amount of d sin ($\beta$). The relected light of wavelength, $\lambda$, will be in phase over the entire wave front when the path difference for rays incident on adjacent grooves is an integral multiple of the wavelength. For light of a given wavelength incident at a particular angle, the light reflected from all of the grooves will be in phase only at certain angles. The number of wavelengths of a path difference from adjacent grooves is called the order of interference, m,. Using the described variables, a grating equation can be written as follows:

$$m\lambda = d (\sin \alpha \pm \sin \beta).$$

When $\beta$ is equal to the blaze angle $\theta$, then $\lambda_\beta$, the first order blaze wavelength can be described as:

$$\lambda_\beta = 2d \sin \theta.$$

For a grating 54 where $\theta$ is 24° and the grating spacing is 527.559 lines/mm, the spacing, d, is equal to 1.89553 $\mu$m. From the equation, $\lambda_\beta$ can be determined as follows:

$$\lambda_\beta = 2d \sin \theta = 2(1.89553 \mu m)(\sin 24°) = 1.541956 \mu m.$$

If the blazed wavelength, $\lambda_\beta$, for the condition $\alpha = \beta$ is known, and the blazed wavelength $\lambda_\beta'$ for other combinations of $\alpha$ and $\beta$ is desired, then the desired values may be determined as follows:

$$\lambda' = \lambda_\beta \cos \left( \frac{\alpha' + \beta}{2} \right)$$

For the particular case of $\lambda_\beta = 1.3 \mu m$, where we want to find the angle normal to the grating that is suitable for our wavelength, the angle may be determined by:

$$\frac{\lambda_\beta'}{\lambda_\beta} = \cos \left( \frac{\alpha' \pm \beta}{2} \right),$$

which may be simplified to produce;

$$\frac{1.31}{1.541956} = 0.843085 = \cos \left( \frac{\alpha' \pm \beta}{2} \right)$$

and $$\cos^{-1} = (0.843085) = 32.53266°.$$

From this value, $\alpha'$ may be determined as follows:

$$\alpha' = 2(32.53266) + 24 = 89.0653'.$$

Another issue regarding the grating 54 is that of resolution. Using a 6 inch wide grating, the grating resolution can be determined using Fraunhofer diffraction theory from the following expression:

$$\frac{\lambda}{\Delta \lambda} = \frac{Nd(\sin \alpha - \sin \beta)}{\lambda}$$

where:

$N$ = number of grooves
 = 527.559 lines/inch
 = 80.4(10³) lines, and $d$ = spacing between grooves ($\mu$)
 = 1.89552(10⁻⁶) meter
 = 1.89552 $\mu$m.

where:

N=number of grooves
=527.559 lines/inch
=80.4(10³) lines,
and
d=spacing between grooves ($\mu$)
=1.89552(10⁻⁶) meter
=1.89552 $\mu$m.

Substituting N and d into the equation results in the expression as follows:

$$\frac{\lambda}{\Delta \lambda} = \frac{80.4(10^3) \text{ lines } * 1.89552(10^{-6}) \text{ meters } * (0.9998669 - 0.4067366)}{1.30(10^{-6}) \text{ meters}}$$

$$\frac{\lambda^2}{0.09039294 \text{ meters}} = \Delta \lambda \text{meters}$$

-continued $$\frac{\lambda}{\Delta\lambda} = \frac{9.039294(10^{-2}) \text{ meters}}{1.30(10^{-6}) \text{ meters}}$$

and $$\text{Å} = \frac{1.8696(10^{-11}) \text{ meters}}{\frac{1(10^{-10}) \text{ meters}}{\text{Å}}} = 0.18696.$$

The resolving power of a grating is a measure of its ability to separate adjacent spectrum lines. It is expressed as $\lambda/\Delta\lambda$, where $\lambda+\Delta\lambda$ is the wavelength of a spectrum line that is just barely distinguishable from a line at wavelength $\lambda$.

Using the techniques developed herein, it should be evident that large gratings used at high angles are needed to achieve high resolving power. The actual attainment of high resolving power with a grating depends upon the optical quality of the grating surface, the uniformity of the spacing of the grooves, and the associated optical components. The equation suggests that one should be ale to have an infinite resolving power simply by increasing the total number of grooves in a given width. However, there is a fundamental rule that has to be applied, (i.e., that it is absolutely necessary that the incident wavelength be less than the groove spacing (d)). If not for the fundamental rule, a grating having 4500 lines/mm would have been selected. Unfortunately, this would have provided a groove spacing of 0.222 $\mu$m, which is 5.85 times too small to provide an effective solution to the problem. Using the techniques described herein, the resolution of the laser 12 has been improved to provide a line width that is approximately 0.18696 Å or $1.8696(10^{-11})$ meter. That is, the line width of the grating 54 spans the range of between 1.300018 and 1.299981 $\mu$m. Effectively, the line width is stable to 5 parts in $10^{11}$. The approximate bandwidth can be shown as follows:

$$\Delta\Phi L = \frac{3.0(10^8)}{4\left(\frac{\Delta\lambda}{\lambda}\right)Y_m} = 2.6075(10^{15})$$

where $Y_m=0.002$, which is a dimensionless material dispersion coefficient.

As mentioned above, the paradigm laser 40 is a low power diode laser operating at 1.3 $\mu$m wavelength. Prior to entry into the paradigm monochrometer 38, the laser beam from the paradigm laser 40 is passed through a 300 Å line filter as a rough control before entry into the monochrometer 38.

Within the monochrometer 38, the beam passes through the expander-collimator 52, onto the grating 54, and is reflected from the parabolic mirror 56, as described above and is passed on by the rotating mirrors 62 and grating 66 of the optoelectronic clock 34. After passing through the grating 66, the beam strikes a InGaAs detector 70 matched to another InGaAs detector 68 detector on the other side of the optical phase lock loop 36. As mentioned above, the paradigm laser 40 is calibrated using the Zeiss DK-2 Spectrophotometer to precisely determine the optical output of the laser 40.

With the transmitter laser 12 slaved to the paradigm laser 40 through the optical phase lock loop 36, the variable controlled output 54 will feed back to the cavity temperature control 20 of the transmitter laser 12 as small increments of voltage control on the heating element surrounding the optical cavity of the transmitting laser 12. In this manner, it has been found that temperature (and length) of the cavity can be more precisely controlled. The feedback signal 54 of the second feedback circuit 14, in fact, has been found to provide a granularity of control 53 times better than the first feedback circuit 13.

Figure 3:
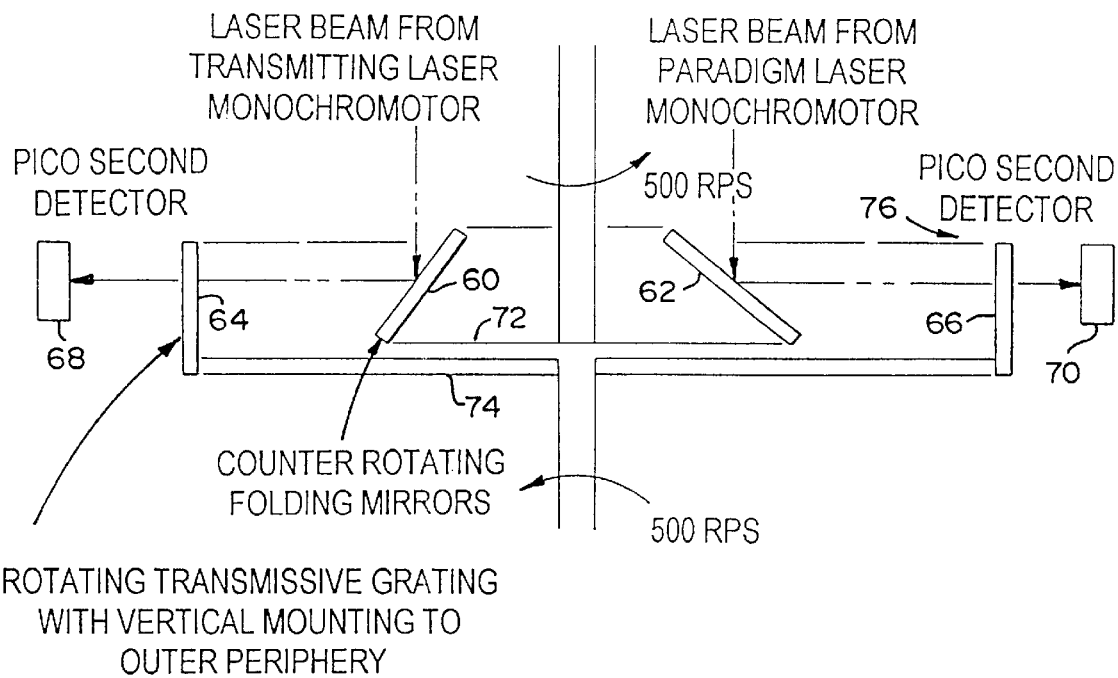
FIG. 3 is a cut-away side view of the optoelectronic clock of FIG. 1.

Turning now to the optoelectronic clock 34, it should be noted, first, that the optoelectronic clock 34 functions as a portion of the second feedback circuit 14 and also as a clock source 45 for modulating information signals onto the laser beam. For purposes of simplicity, FIG. 3 will be used to explain both functions.

The laser transmission system 10 of FIG. 1 is provided for the modulation and transmission of up to 1,000 television channels. Since each television channel (including guard bands) requires 6.2 MHZ, the modulation capabilities of the system 10 of the invention would be expected to be at least 6.2 Ghz.

Further, to modulate a channel onto the laser beam, a clock signal is required every 6.2 MHZ throughout the transmission spectrum. One of the features of the clock 34 is a practical method of providing a multitude of such incremental frequencies.

The essence of the clock 34 is two counter-rotating disks 72, 74. The two disks 72, 74 may be driven by variable speed motors (e.g., Dremel motors). The variable speed capability of the disks 72, 74 is such that the speed may be continuously varied from a low of 83.33 revolutions per second (rps) to 25.3($10^4$) rps. Under an embodiment, the speed of the inner disk 72 is chosen to be 500 rps. The two disks 72, 74 rotate in opposite directions.

A number of mirrors 60, 62 are mounted to the inner mirror disk 72. More specifically, sixteen mirrors 60, 62 are mounted at a 45° angle to a rotational axis of the disk 72 around the periphery of the disk 72 at a radius of 63.5 mm. The mirrors 60, 62 are mounted such that a light beam traveling parallel to the axis of rotation of the disk 72 would be reflected radially through a rotating transmissive grating 64, 66 on the second disk 74 at a predetermined angle of the disks 72, 74 to strike a set of stationary detectors 68, 70.

The second disk 74 rotates at a speed of $15.27887(10^3)$ rps. The second disk may be equipped with an annular ring 76 of a radius of 97.0209 mm, fitted a rotating transmissive grating 64, 66.

The total cycles per second produced by the optoelectronic clock 34 may be determined by the equation;

$$v_o = \alpha\beta(N_m x + Y),$$

where:

α=grating lines/mm,

β=circumference of the second disk, x=rps of the mirror disk,

Y=rps of the second disk and $N_m$=number of mirrors on the mirror disk.

As should be apparent from the equation, the frequency of the signal detected by the detectors 68, 70 can be adjusted by changing the gratings, the number of mirrors, the radius of the mirrors, or the radius of the grating. Having passed through the grating 64, 66, the laser beam strikes the detectors 68, 70 providing an electrical signal that is conditioned and amplified to establish a particular tuning frequency.

For purposes of the second feedback circuit 14 alone, the speed of the counter-rotating disks 72, 74 is not considered critical. As a consequence, the disks 72, 74 may be operated at a speed convenient for generation of reference frequencies. Of more importance for purposes of the second feedback circuit 14 is the ability of the disks 72, 74 to chop a light beam from both the transmitting laser 12 and from the paradigm laser 40 into light pulses that may be compared as to phase and intensity.

Figure 4:
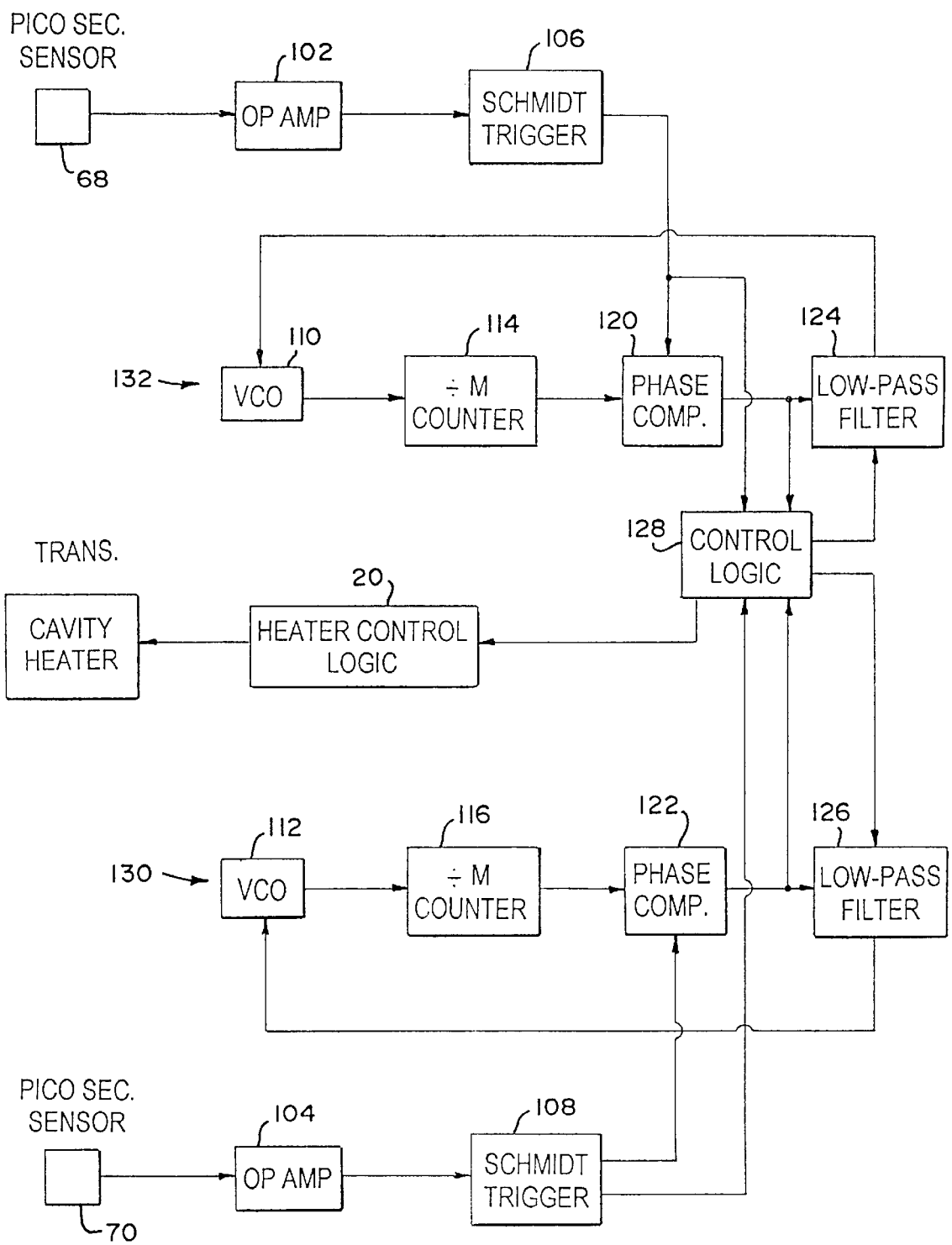
FIG. 4 is a block diagram of the phase lock loop of FIG. 1.

FIG. 4 is a block diagram of the phase lock loop circuit 36. As shown, an output of the sensors 68, 70 is shaped within an op amp 102, 104 and Schmidt trigger 106, 108. The shaped pulses are passed through a loop filter 130, 132 before comparison in a control logic section 128.

From the detectors 68, 70, the level of the signal requires amplification to raise the signal to a sufficient level to trigger the Schmidt trigger 106, 108. The signal from the detector 70 of the paradigm laser 40 uses a non-inverting op amp 104. The signal from the detector 68 of the transmitting laser 12 may use an inverting op amp 102. It should be noted that it is not all that important that the input signal from the detectors 68, 70 match, but only the square wave of the Schmidt triggers 106, 108 substantially match.

The loop filters 130, 132 provide a means of averaging an output of the phase lock loop 36. A signal from the loop filter 130, 132 is compared with an output of the Schmidt trigger 106, 108 in control logic 128 (e.g., an XOR gate) to identify and reinforce coincidence of phase and amplitude relationships between the transmitting laser 12 and paradigm laser 40. The output of the control logic 128 is then scaled and provided as a control output of the second feedback circuit 14 through the heater control logic 20.

A specific embodiment of a novel method and apparatus for construction of a stabilized laser according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

I claim:

1. A method of stabilizing a distributed feedback semiconductor laser, such method comprising the steps of:

comparing an optical output of a first oscillating mode of the semiconductor laser at a first polarization angle with an optical output of a second oscillating mode of the semiconductor laser at a second polarization angle orthogonal to the first polarization angle;

providing a first feedback signal to a cavity temperature controller of the semiconductor laser in response to detected differences of the compared first and second oscillating modes;

comparing an output of a reference laser with an output of the semiconductor laser; and providing a difference signal as a second feedback signal to the temperature controller of the semiconductor laser in response to detected differences between the reference laser and semiconductor laser.

2. The method of stabilizing a distributed feedback semiconductor laser as in claim 1 further comprising the step of polarizing an output of the semiconductor laser at the first polarization angle to produce a laser signal of the first oscillating mode.

3. The method of stabilizing a distributed feedback semiconductor laser as in claim 1 further comprising the step of polarizing an output of the semiconductor laser at the second polarization angle to produce a laser signal of the second oscillating mode.

4. The method of stabilizing a distributed feedback semiconductor laser as in claim 1 further comprising the step of detecting the laser signal of the first oscillating mode in a first photodiode.

5. The method of stabilizing a distributed feedback semiconductor laser as in claim 1 further comprising the step of detecting the laser signal of the second oscillating mode in a second photodiode.

6. The method of stabilizing a distributed feedback semiconductor laser as in claim 1 wherein the step of comparing an output of the reference laser with an output of the semiconductor laser further comprises the step of chopping an output of the semiconductor laser and reference laser into a first and second optical pulse of predetermined lengths.

7. The method of stabilizing a distributed feedback semiconductor laser as in claim 6 wherein the step of chopping the semiconductor and reference outputs into optical pulses further comprises the step of disposing a first reflecting mirror on a rotating disk which reflects incident radiation from the semiconductor laser radially outward from the rotating disk as the rotating disk passes through a predetermined angle.

8. The method of stabilizing a distributed feedback semiconductor laser as in claim 7 wherein the step of chopping the semiconductor and reference outputs into optical pulses further comprises the step of disposing a second reflecting mirror on a rotating disk which reflects incident radiation from the reference laser radially outward from the rotating disk as the rotating disk passes through a predetermined angle.

9. The method of stabilizing a distributed feedback semiconductor laser as in claim 8 wherein the step of chopping the semiconductor and reference outputs into optical pulses further comprises the step of disposing a counter-rotating annulate around the rotating disk rotating synchronously with and in a same plane as the rotating disk.

10. The method of stabilizing a distributed feedback semiconductor laser as in claim 9 wherein the step of chopping the semiconductor and reference outputs into optical pulses further comprises the step of disposing a first transmissive grating in a predetermined circumferential location of the counter-rotating annulate in the path of the reflected radiation from the semiconductor laser to provide the chopped optical pulse of the semiconductor laser.

11. The method of stabilizing a distributed feedback semiconductor laser as in claim 10 wherein the step of chopping the semiconductor and reference outputs into optical pulses further comprises the step of disposing a second transmissive grating in a predetermined circumferential location of the counter-rotating annulate in the path of the reflected radiation from the reference laser to provide the chopped optical pulse of the reference laser.

12. The method of stabilizing a distributed feedback semiconductor laser as in claim 11 wherein the step of chopping the semiconductor and reference outputs into optical pulses further comprises the step of detecting the chopped optical pulse of the semiconductor laser.

13. The method of stabilizing a distributed feedback semiconductor laser as in claim 12 wherein the step of chopping the semiconductor and reference outputs into optical pulses further comprises the step of detecting the chopped optical pulse of the reference laser.

14. The method of stabilizing a distributed feedback semiconductor laser as in claim 13 wherein the step of providing a difference signal further comprises the step of comparing the detected chopped optical pulses of the semiconductor and reference lasers.

15. A stabilized distributed feedback semiconductor laser, comprising:

means for comparing an optical output of a first oscillating mode of the semiconductor laser at a first polarization angle with an optical output of a second oscillating mode of the semiconductor laser at a second polarization angle orthogonal to the first polarization angle;

means for providing a first feedback signal to a cavity temperature controller of the semiconductor laser in response to detected differences of the compared first and second oscillating modes;

means for comparing an output of a reference laser with an output of the semiconductor laser; and means for providing a difference signal as a second feedback circuit to the temperature controller of the semiconductor laser in response to detected differences between the reference laser and semiconductor laser.

16. The stabilized distributed feedback semiconductor laser as in claim 15 further comprising means for polarizing an output of the semiconductor laser at the first polarization angle to produce a laser signal of the first oscillating mode.

17. The stabilized distributed feedback semiconductor laser as in claim 15 further comprising means for polarizing an output of the semiconductor laser at the second polarization angle to produce a laser signal of the second oscillating mode.

18. The stabilized distributed feedback semiconductor laser as in claim 15 further comprising means for detecting the laser signal of the first oscillating mode.

19. The stabilized distributed feedback semiconductor laser as in claim 15 further comprising means for detecting the laser signal of the second oscillating mode.

20. The stabilized distributed feedback semiconductor laser as in claim 15 wherein the means for comparing an output of the reference laser with an output of the semiconductor laser further comprises means for chopping an output of the semiconductor laser and reference laser into a first and second optical pulse of predetermined lengths.

21. The stabilized distributed feedback semiconductor laser as in claim 20 wherein the means for chopping the semiconductor and reference outputs into optical pulses further comprises a first reflecting mirror disposed on a rotating disk which reflects incident radiation from the semiconductor laser radially outward from the rotating disk as the rotating disk passes through a predetermined angle.

22. The stabilized distributed feedback semiconductor laser as in claim 21 wherein the means for chopping the semiconductor and reference outputs into optical pulses further comprises a second reflecting mirror disposed on the rotating disk which reflects incident radiation from the reference laser radially outward from the rotating disk as the rotating disk passes through a predetermined angle.

23. The stabilized distributed feedback semiconductor laser as in claim 22 wherein the means for chopping the semiconductor and reference outputs into optical pulses further comprises a counter-rotating annulate disposed around the rotating disk rotating synchronously with and in a same plane as the rotating disk.

24. The stabilized distributed feedback semiconductor laser as in claim 23 wherein the means for chopping the semiconductor and reference outputs into optical pulses further comprises the a first transmissive grating disposed in a predetermined circumferential location of the counter-rotating annulate in the path of the reflected radiation from the semiconductor laser to provide the chopped optical pulse of the semiconductor laser.

25. The stabilized distributed feedback semiconductor laser as in claim 24 wherein the means for chopping the semiconductor and reference outputs into optical pulses further comprises a second transmissive grating disposed in a predetermined circumferential location of the counter-rotating annulate in the path of the reflected radiation from the reference laser to provide the chopped optical pulse of the reference laser.

26. The stabilized distributed feedback semiconductor laser as in claim 25 wherein the means for chopping the semiconductor and reference outputs into optical pulses further comprises means for detecting the chopped optical pulse of the semiconductor laser.

27. The stabilized distributed feedback semiconductor laser as in claim 26 wherein the means for chopping the semiconductor and reference outputs into optical pulses further comprises means for detecting the chopped optical pulse of the reference laser.

28. The stabilized a distributed feedback semiconductor laser as in claim 27 wherein the means for providing a difference signal further comprises means for comparing the detected chopped optical pulses of the semiconductor and reference lasers.

29. A stabilized distributed feedback semiconductor laser, comprising:

a first comparator which compares an optical output of a first oscillating mode of the semiconductor laser at a first polarization angle with an optical output of a second oscillating mode of the semiconductor laser at a second polarization angle orthogonal to the first polarization angle;

a voltage controlled oscillator which provides a first feedback signal to a cavity temperature controller of the semiconductor laser in response to detected differences of the compared first and second oscillating modes;

a second comparator which compares an output of a reference laser with an output of the semiconductor laser; and an amplifier for providing a difference signal as a second feedback circuit to the temperature controller of the semiconductor laser in response to detected differences between the reference laser and semiconductor laser.

30. The stabilized distributed feedback semiconductor laser as in claim 29 further comprising a first polarizing lens which polarizes an output of the semiconductor laser at the first polarization angle to produce a laser signal of the first oscillating mode.

31. The stabilized distributed feedback semiconductor laser as in claim 29 further comprising a second polarizing lens which polarizes an output of the semiconductor laser at the second polarization angle to produce a laser signal of the second oscillating mode.

32. The stabilized distributed feedback semiconductor laser as in claim 29 further comprising a first photodetector which detects the laser signal of the first oscillating mode.

33. The stabilized distributed feedback semiconductor laser as in claim 29 further comprising a second photodetector which detects the laser signal of the second oscillating mode.

34. The stabilized distributed feedback semiconductor laser as in claim 29 wherein the first comparator which compares an output of the reference laser with an output of the semiconductor laser further comprises an optical chopper which chops an output of the semiconductor laser and reference laser into a first and second optical pulse of predetermined lengths.

35. The stabilized distributed feedback semiconductor laser as in claim 34 wherein the chopper which chops the semiconductor and reference outputs into optical pulses further comprises a first reflecting mirror disposed on a rotating disk which reflects incident radiation from the semiconductor laser radially outward from the rotating disk as the rotating disk passes through a predetermined angle.

36. The stabilized distributed feedback semiconductor laser as in claim 35 wherein the chopper which chops the semiconductor and reference outputs into optical pulses further comprises a second reflecting mirror disposed on the rotating disk which reflects incident radiation from the reference laser radially outward from the rotating disk as the rotating disk passes through a predetermined angle.

37. The stabilized distributed feedback semiconductor laser as in claim 36 wherein the chopper which chops the semiconductor and reference outputs into optical pulses further comprises a counter-rotating annulate disposed around the rotating disk rotating synchronously with and in a same plane as the rotating disk.

38. The stabilized distributed feedback semiconductor laser as in claim 37 wherein the chopper which chops the semiconductor and reference outputs into optical pulses further comprises the a first transmissive grating disposed in a predetermined circumferential location of the counter-rotating annulate in the path of the reflected radiation from the semiconductor laser to provide the chopped optical pulse of the semiconductor laser.

39. The stabilized distributed feedback semiconductor laser as in claim 38 wherein the chopper which chops the semiconductor and reference outputs into optical pulses further comprises a second transmissive grating disposed in a predetermined circumferential location of the counter-rotating annulate in the path of the reflected radiation from the reference laser to provide the chopped optical pulse of the reference laser.

40. The stabilized distributed feedback semiconductor laser as in claim 39 wherein the chopper which chops the semiconductor and reference outputs into optical pulses further comprises a third photodetector which detects the chopped optical pulse of the semiconductor laser.

41. The stabilized distributed feedback semiconductor laser as in claim 40 wherein the chopper which chops the semiconductor and reference outputs into optical pulses further comprises a fourth photodetector which detects the chopped optical pulse of the reference laser.

42. The stabilized a distributed feedback semiconductor laser as in claim 41 wherein the amplifier which provides a difference signal further comprises a differential amplifier which compares the detected chopped optical pulses of the semiconductor and reference lasers.

43. A stabilized semiconductor distributed feedback laser system comprising:
a semiconductor distributed feedback laser;
a first feedback circuit to a cavity temperature controller of the semiconductor laser comprising:
a differential input voltage controller oscillator which provides an output of the first feedback circuit to the cavity temperature controller;
a first photodiode receiving a polarized output of the semiconductor laser at a first polarization angle and providing a first differential input to the voltage controlled oscillator;
a second photodiode receiving a polarized output of the semiconductor laser at a second polarization angle orthogonal to the first polarization angle and providing a second differential input to the voltage controlled oscillator;
a second feedback circuit to the cavity temperature controller of the semiconductor laser comprising:
a reference laser; and a comparator which compares a power output of the reference laser with a power output of the semiconductor laser and which provides a difference signal as an output of the second feedback circuit to the temperature controller of the semiconductor laser.

44. The stabilized semiconductor laser as in claim 43 wherein the comparator of the second feedback circuit further comprises:
a first rotating disk with an axis of rotation of the disk parallel to an output of the semiconductor laser and the reference laser.

45. The stabilized semiconductor laser as in claim 44 wherein the comparator of the second feedback circuit further comprises:
a first mirror disposed on the rotating disk which reflects an output of the semiconductor laser radially from the rotating disk as the rotating disk rotates through a predetermined angle in its rotation.

46. The stabilized semiconductor laser as in claim 45 wherein the comparator of the second feedback circuit further comprises:
a second mirror disposed on the rotating disk which reflects an output of the reference laser radially from the rotating disk as the rotating disk rotates through the predetermined angle.

47. The stabilized semiconductor laser as in claim 45 wherein the comparator of the second feedback circuit further comprises:
a first stationary photodiode disposed to receive the output of the semiconductor laser reflected from the first mirror at the predetermined angle of the rotating disk.

48. The stabilized semiconductor laser as in claim 47 wherein the comparator of the second feedback circuit further comprises:
a second stationary photodiode disposed to receive the output of the reference laser reflected from the second mirror at the predetermined angle of the rotating disk.

49. The stabilized semiconductor laser as in claim 48 wherein the comparator of the second feedback circuit further comprises a counter-rotating annulate disposed between the first mirror and first photodiode and second mirror and second photodiode which rotates synchronously with the rotating disk in an opposite direction as the rotating disk.

50. The stabilized semiconductor laser as in claim 49 wherein the counter-rotating annulate further comprises a first transmissive grating disposed on the annulate in a first circumferential position between the first mirror and first photodiode as the rotating disk passes through the predetermined angle and which chops the reflected output of the semiconductor laser from the first mirror to the first photodiode into at least one pulse.

51. The stabilized semiconductor laser as in claim 50 wherein the counter-rotating annulate further comprises a second transmissive grating disposed on the annulate in a second circumferential position between the first mirror and first photodiode as the rotating disk passes through the predetermined angle and which chops the reflected output of the reference laser from the second mirror to the second photodiode into at least one pulse.

52. The stabilized semiconductor laser as in claim 51 wherein the comparator of the second feedback circuit further comprises a differential amplifier which receives as inputs the outputs of the first and second photodiodes and which provides a differential output as a feedback signal to the cavity temperature controller of the semiconductor laser.

* * * * *